United States Patent [19]
Probst et al.

[11] Patent Number: 5,676,766
[45] Date of Patent: Oct. 14, 1997

[54] SOLAR CELL HAVING A CHALCOPYRITE ABSORBER LAYER

[75] Inventors: Volker Probst; Franz Karg, both of München, Germany

[73] Assignee: Siemens Aktiengesellschaft, Munich, Germany

[21] Appl. No.: 619,590

[22] PCT Filed: Sep. 28, 1994

[86] PCT No.: PCT/DE94/01125

§ 371 Date: Mar. 26, 1996

§ 102(e) Date: Mar. 26, 1996

[87] PCT Pub. No.: WO95/09441

PCT Pub. Date: Apr. 6, 1995

[30] Foreign Application Priority Data

Sep. 30, 1993 [DE] Germany .............. 43 33 407.5

[51] Int. Cl.[6] ................................................. H01C 31/06
[52] U.S. Cl. ..................................................... 136/265
[58] Field of Search .......................................... 136/265

[56] References Cited

U.S. PATENT DOCUMENTS

| 4,536,607 | 8/1985 | Wiesmann | 136/249 TJ |
| 4,642,140 | 2/1987 | Noufi et al. | 148/270 |
| 4,915,745 | 4/1990 | Pollock et al. | 136/265 |
| 5,141,564 | 8/1992 | Chen et al. | 136/258 |

FOREIGN PATENT DOCUMENTS

| 0360403 | 3/1990 | European Pat. Off. | 136/265 |
| 5-315633 | 11/1993 | Japan | 136/265 |
| WO90/15445 | 12/1990 | WIPO | 136/264 |

OTHER PUBLICATIONS

Solar Energy Materials, vol. 23, No. 1, Nov. 1991, C. Guillen et al, "Optical properties of electrochemically deposited CuInSe/2 thin films", pp. 31–45.

*Primary Examiner*—Aaron Weisstuch
*Attorney, Agent, or Firm*—Hill, Steadman & Simpson

[57] ABSTRACT

A solar cell has a chalcopyrite absorber layer that is applied on the substrate side over an adhesive layer which is chosen from chromium, titanium, tantalum, and titanium nitride.

3 Claims, 1 Drawing Sheet

SOLAR CELL HAVING A CHALCOPYRITE ABSORBER LAYER

BACKGROUND OF THE INVENTION

A main objective in photovoltaics is the development of solar cells with the best possible long-term stability and high efficiency, with simultaneously low production costs. Only then will this form of energy production be competitive with other conventional methods.

As regards efficiency and long-term stability, solar modules of monocrystalline silicon are presently considered as standard. Because of high production costs and long energy return times, i.e. periods over which the energy used in production is compensated for by photovoltaic power generation, solar power from such standard modules has not yet reached the threshold of competitiveness.

Solar cells of polycrystalline I-III-VI$_2$ chalcopyrite semiconductors are presently expected to make promising contributions in the production of cost-efficient and long-term stable solar cells. In particular, CuInSe$_2$ (CIS) and related alloys are materials which have a high absorption coefficient, a direct band transition and a band gap that is matched to the solar spectrum. They can be produced using cost-effective thin-film deposition methods and have already reached efficiencies of almost 17% in laboratory tests.

A cell structure disclosed by U.S. Pat. No. 5,141,564 consists of a glass substrate, a molybdenum back electrode, a 1 to 5 μm thick absorber layer of polycrystalline chalcopyrite semiconductor of composition CuInGaSe$_2$ or CuIn(S,Se)$_2$, a thin cadmium sulfide window layer and a transparent front electrode.

Until now, disadvantages with CIS solar cells have been the poor adhesion of the absorber layer on the molybdenum back electrode and the poor reproducibility, the basis of which is the complex production process for ternary semiconductors.

For production, the components are applied over the substrate in elemental form, either one after the other or together, and are made to react with one another by establishing suitable reaction conditions (2-stage process). It is also possible to apply only the two metallic components and to prepare the nonmetallic reaction partner using a correspondingly reactive atmosphere. A further possibility consists in vapor-depositing the starting components in elemental form onto a preheated substrate, the reaction to form the ternary semiconductor taking place directly before or after the components reach the substrate. This one-stage process is, however, difficult to carry out as a full-surface deposition process, since layer uniformity cannot be ensured with relatively large areas.

Particularly in the case of the two-stage process, detachment of the absorber layer from the molybdenum back electrode is observed and in the production of solar cells this directly leads to a batch of nonfunctioning or reduced-power solar cells. Further damage due to layer detachment can be observed during subsequent operation of the solar cells, as a result of differential thermal loading between daytime and nighttime or when the seasons change.

U.S. Pat. No. 4,915,745 discloses the use of a Ga intermediate layer as an adhesive between a molybdenum back electrode and a CIS layer. Although the adhesion of the absorber layer on the back electrode is thereby improved, the homogeneity of the layers is nevertheless simultaneously reduced.

International application WO 90/15 445 A 1 discloses a tellurium intermediate layer, the purpose of which is for the adhesion between the molybdenum back electrode and the absorber layer to be improved. A disadvantage with this method is, as with U.S. Pat. No. 4,915,745 mentioned above, the introduction of a new and, in the case of tellurium, also toxic material into the layer structure of the CIS solar cell. This increases the complexity of the depositions and therefore the expenditure in production. In addition, problems arise in the disposal of solar cells that are no longer capable of functioning.

SUMMARY OF THE INVENTION

The object of the present invention is therefore to provide a solar cell that has improved adhesion between the substrate and the absorber layer, does not contain any additional toxic materials and has a production outlay that is not, or substantially not, increased compared to known methods.

In general terms the present invention is a solar cell having an electrically nonconductive substrate, a back electrode and having a chalcopyrite absorber layer of general composition CuIn$_{1-x}$Ga$_x$S$_{1-y}$Se$_y$ ($1 \geq x, y \geq 0$). An intermediate layer of a material is chosen from Cr, Ti, Ta and titanium nitride is arranged between the absorber layer and the back electrode. The intermediate layer has a thickness of 1–40 nm.

Advantageous developments of the present invention are as follows. The intermediate layer is of titanium nitride and is arranged over a titanium back electrode.

The intermediate layer is arranged over a molybdenum back electrode.

As in the case of the last two mentioned documents, the adhesive layer is introduced in order to solve the problem of adhesion of the absorber layer to the back electrode. The adhesive is either chosen from the reactive metals chromium, titanium and tantalum or consists of a titanium nitride layer. These adhesive layers are simple to produce using conventional systems, and production thereof can be integrated very well into a conventional production process for chalcopyrite solar cells.

Chromium, which leads to very good adhesion of the chalcopyrite absorber layer, is used as preferred material for the adhesion layer. In addition, with chromium the yield of functional solar cells in the production method is increased and the power or efficiency of the solar cells fabricated thereby is improved. Moreover, chromium has already been used with known methods in the layer structure as an adhesive layer between the substrate and molybdenum back electrode. The introduction of a new material into the layer structure is therefore not necessary and it is possible to use the already existing system and the same technique.

Nevertheless, the other proposed reactive metals titanium and tantalum are effective as adhesives and can be used without problems.

It is also possible, according to the invention, to apply one of the reactive metals chromium, titanium, and tantalum as an adhesive intermediate layer between the absorber layer and a molybdenum back electrode. In this case, layer thicknesses from 1 nm upwards are sufficient, and those of 10 to 40 nm are preferred. This intermediate layer prevents the semiconductor component selenium from reacting to form a molybdenum selenide with the molybdenum back electrode during the formation of the absorber layer. With known methods, the cause of the adhesion problems resides in these molybdenum selenides, since molybdenum selenide, like molybdenum sulfide, represents a known lubricant and friction reducer.

In a further development of the invention it is proposed to provide a titanium nitride adhesive layer over a back electrode consisting of titanium. This material combination, known to date only from microelectronics and used therein for the production of contacts, is likewise outstandingly suitable for improving adhesion of the absorber layer on the substrate.

Only a single system is required for producing the layer combination, since both layers can be produced in the same system. If, for example, a sputtering method is used for applying the titanium layer, then the admixture of nitrogen or nitrogen-containing compounds to the sputtering atmosphere can straightforwardly be used for changing over to the deposition of titanium nitride.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

DESCRIPTION OF THE PREFERRED EMBODIMENTS

Figure 1:
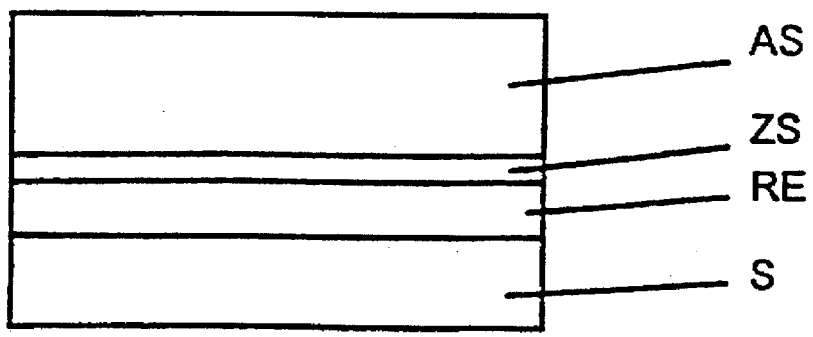
FIG. 1 shows a detail of a structure according to the present invention in schematic cross section.

First illustrative embodiment:

Referring to FIG. 1, in conventional fashion, a plate of window glass is used as the substrate S. It is also possible to produce the substrate S from any desired electrically non-conducting or conducting materials. If window glass (soda lime glass) is used, then it can be provided with a adhesive layer, for example with a thin sputtered chromium layer (not represented in the figure).

The back electrode RE is then applied onto the substrate S by sputtering on an approximately 1 μm thick molybdenum layer. Onto this structure, which is thus far already known, a thin adhesive intermediate layer ZS is then applied. Current thin-film coating methods, for example vapor deposition, electrolytic deposition or preferably sputtering, are suitable for this purpose. Chromium, titanium or tantalum is chosen as material for the intermediate layer. The intermediate layer is effective with a thickness starting from approximately 1 nm and is preferably applied with a thickness of 5 to 40 nm. An absorber layer AS is then applied using a thin-film coating method onto the substrate S that is provided with the back electrode RE and the intermediate layer ZS. A layer structure, consisting of elemental individual layers of the starting components of the compound semiconductor, can be deposited in this manner using suitable methods such as, for example, sputtering, vapor deposition or electrolytic deposition. For example, for this purpose individual layers of copper, indium and selenium are respectively produced at a thickness such that the compound semiconductor of the absorber layer AS contains the desired stoichiometry and thickness. The metals copper and indium are in this case applied at a molar ratio of $0.85 < Cu/In < 1.0$. Because of their volatility, the nonmetallic components are vapor deposited thereon in a stoichiometric excess of 0 to 100%, typically in an excess of 40%. The layer thicknesses of the element layers can be varied in such a way that the absorber layer reaches a thickness of 1 to 3 μm.

The layer structure consisting of the elemental individual layers is then converted into the compound semiconductor of the absorber layer by heat-treatment in an inert or reactive atmosphere. For this purpose, a fast heat-treatment process can be carried out. In addition, for this purpose, the layer structure can be encapsulated or covered, so that evaporation of volatile components is prevented.

A further possibility of producing the layer structure as preliminary stage of the compound semiconductor consists in two of the components being deposited as binary compounds over the prepared substrate and the third component being applied as an elemental layer. Suitable binary compounds are selenides of indium and gallium.

In a further variant of the method, which aims at a more homogeneous absorber layer AS, the layer structure for the future absorber layer is produced in the form of more than three individual layers, it being possible for the layer sequence to be repeated.

It is also possible to apply the compound semiconductor in a one-stage process by simultaneous vapor deposition on the preheated substrate. Since the reaction to form the compound semiconductor already takes place during the deposition, no heat-treatment process is necessary in this variant.

After the absorber layer AS has been produced, its adhesion on the substrate or on the substrate provided with the back electrode RE and the intermediate layer ZS is tested. For this purpose, in a peel test, an adhesive tape is bonded onto the absorber layer and then pulled off. It is found that, regardless of the way in which the absorber layer AS is produced, considerably better adhesion is achieved with the structure represented in FIG. 1. It is also found that, even at this point in the production process, a substantially higher percentage of fully undamaged or fully functional products is obtained (compared to samples produced without an intermediate layer ZS).

Second illustrative embodiment:

Referring again to FIG. 1, in a further variant of the method, a titanium back electrode RE is applied over the substrate S in a suitable thin-film process. A titanium nitride intermediate layer ZS is produced thereover by sputtering titanium in a nitrogen-containing atmosphere.

The structure of the absorber layer AS can, as described in the first illustrative embodiment, be produced from a chalcopyrite semiconductor using any desired known method.

Improved adhesion of the absorber layer AS over the intermediate layer ZS is exhibited with this structure as well.

Figure 2:
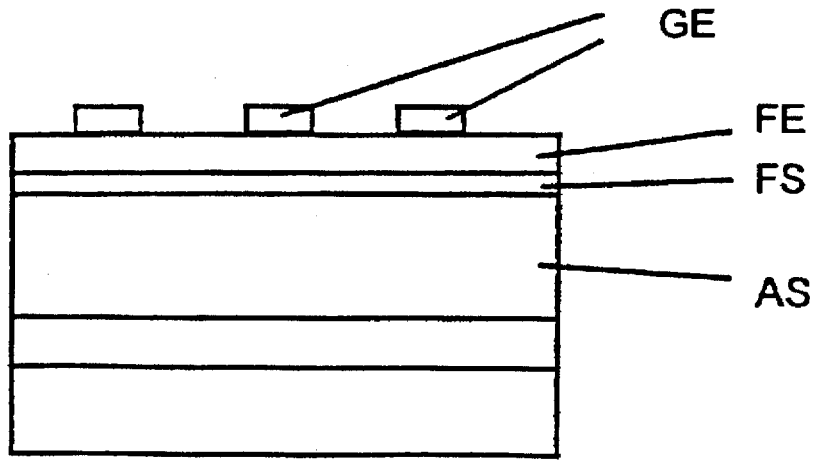
FIG. 2 shows the possible structure of a complete solar cell in schematic cross section.

Fabrication of the solar cell structure:

Referring to FIG. 2, for fabrication of the solar cell, an n-conducting window layer FS, for example a 10 to 50 nm thick cadmium sulfide layer, is produced over the absorber layer AS using known methods.

The solar cell structure is completed by a transparent front electrode FE, for example, an approximately 1 μm thick zinc oxide layer, which can be sputtered or deposited using a CVD method. It is also possible to use other transparent oxides.

In order to improve current flow via the front electrode FE, it is optionally possible also to apply a grid electrode GE, for example by vapor deposition of an electrically conductive metal such as, for example, silver, nickel, copper or the like, or by printing on and thermally setting a conductive paste or by applying a corresponding structure of a conductive varnish or conductive adhesive.

Efficiencies of over 10% and mean efficiencies of 9% based on the total substrate area of approximately 10×10 $cm^2$ have to date been achieved with solar cells thus produced.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A solar cell comprising:

an electrically nonconductive substrate; a back electrode on the substrate; and a chalcopyrite absorber layer of general composition $CuIn_{1-x}Ga_xS_{1-y}Se_y$ ($1 \geq x,y \geq 0$), in which an intermediate layer of a material which is chosen from Cr, Ti, Ta, and titanium nitride is arranged between the absorber layer and the back electrode, the intermediate layer having a thickness of 1–40 nm.

2. The solar cell as claimed in claim 1, wherein the intermediate layer is titanium nitride and wherein the back electrode is titanium.

3. The solar cell as claimed in claim 1, wherein the back electrode is molybdenum.

* * * * *